June 20, 1967 R. J. CARPENTER 3,327,239
FOUR-TERMINAL DIRECT-CURRENT AMPLIFIER
Filed Jan. 6, 1964
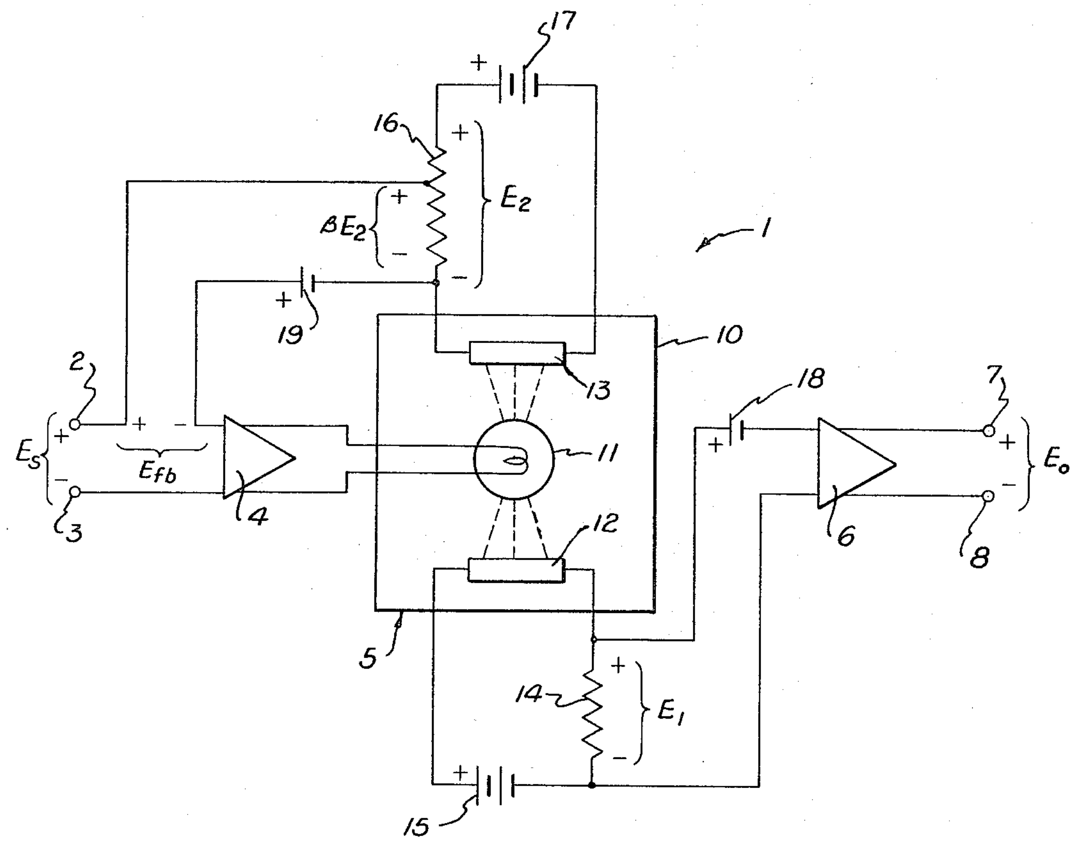
INVENTOR
Robert J. Carpenter
BY Alvin J. Englert
AGENT United States Patent Office 3,327,239
Patented June 20, 1967

3,327,239
FOUR-TERMINAL DIRECT-CURRENT AMPLIFIER

Robert J. Carpenter, Bethesda, Md., assignor to the United States of America as represented by the Secretary of Commerce Filed Jan. 6, 1964, Ser. No. 336,082
3 Claims. (Cl. 330—59)

ABSTRACT OF THE DISCLOSURE

Two direct-current amplifying stages are coupled by a lamp-photosensitive cell coupling unit to form a four-terminal device. An additional photosensitive cell is exposed to the lamp and arranged in a negative feedback loop around the stage energizing the lamp, to correct for the nonlinear transfer characteristic of the coupling unit.

This invention relates to a four-terminal direct-current amplifier utilizing lamp-photosensitive cell coupling means.

In the art, various direct-coupled amplifier circuits have been devised for amplifying slowly varying and direct-current signals. Most of these amplifier circuits, however, are of the three-terminal type, in which one terminal is common to both the input and output terminal pairs. Such amplifiers cannot be used where it is necessary to maintain complete isolation between the signal source and amplifier load device. In the latter instance, a four-terminal direct-current amplifier is required.

To obtain four-terminal characteristics, it has been proposed to insert a lamp-photosensitive cell coupling unit between two successive stages of a direct-coupled amplifier. The lamp would be connected to the output of the first stage, and the photosensitive cell would be connected to the input of the second stage. Thus the signals being amplified would be converted into varying intensity light, and the light would be reconverted to signals. Since the lamp and photosensitive cell are each unilateral devices, the amplifier would also be unilateral. Changes in the load device connected to the amplifier could not be reflected to the signal source driving the amplifier.

The proposed coupling unit has not been widely used, however, because of its nonlinear transfer characteristic. It is generally found that the voltage derived from the photosensitive cell is a poor replica of the voltage applied to the lamp.

Although it is well known that the provision of a negative feedback loop around an amplifier tends to reduce distortions due to nonlinear transfer elements in the amplifier circuit, such feedback loops have not been employed in the proposed amplifiers, because the loops would introduce metallic connections bridging the lamp-photosensitive cell coupling unit and thereby defeat the purpose of the coupling unit.

In accordance with the present invention, it is possible to incorporate negative feedback in an amplifier having a lamp-photosensitive cell coupling unit and still maintain the four-terminal characteristic of the unit. Briefly, in the present invention there is provided a novel coupling unit having a lamp and a pair of substantially identical photosensitive cells arranged to receive substantially identical illumination from the lamp. One of the cells is utilized to drive the next stage of the amplifier, while the other cell is utilized to provide a feedback signal to the stage which energizes the lamp. Thus, the feedback loop is coupled into the light produced by the lamp, thereby avoiding metallic connections around the signal coupling unit.

Accordingly, it is an object of this invention to provide a four-terminal direct-current amplifier that is highly linear and stable in response.

Another object is to provide a four-terminal direct-current amplifier that employs a minimum number of inexpensive components.

These and other objects of the present invention will be readily apparent from the following description and drawing, the drawing having a single figure showing an amplifier circuit that illustrates the principles of the present invention.

The four-terminal direct-current amplifier 1 illustrated in the figure has input terminals 2, 3, a first direct-coupled voltage amplifying stage 4, a coupling unit 5, a second direct-coupled voltage amplifying stage 6, and output terminals 7, 8.

The coupling unit 5 comprises a light-tight housing 10 in which there is mounted a lamp 11 and a pair of substantially identical photosensitive cells 12, 13. The cells 12, 13 are symmetrically arranged on either side of the lamp 11 so as to receive substantially identical illumination therefrom. In a preferred embodiment of the invention, the lamp 11 comprises a tungsten incandescent lamp, although any lamp having a continuously-increasing illumination versus voltage characteristic may be employed. The preferred photosensitive cells 12, 13 are photoconductive cells; the invention is not limited thereto, however. In the following discussion, the cells 12, 13 will be considered as being of the photoconductive type.

The photoconductive cells 12, 13 decrease in resistance as the illumination from lamp 11 increases. To derive voltage signals from these resistance changes, cell 12 is connected in series with a fixed voltage-dividing resistor 14 and a battery 15; and cell 13 is similarly connected in series with a resistor 16 and battery 17. The resistors 14, 16 are substantially identical, as are the batteries 15, 17. Consequently, for any illumination from lamp 11, substantially identical direct-current voltage $E_1$, $E_2$ are developed across the resistors 14, 16. As the illumination from lamp 11 increases, the resistances of the cells 12, 13 decrease, causing the voltage drops $E_1$, $E_2$ to increase. Thus the voltages $E_1$, $E_2$ increase as the illumination of lamp 11 increases.

The voltage $E_1$ is connected in series opposition with a biasing battery 18, and the resultant voltage is applied to the input of the second amplifying stage 6. The output of stage 6 is directly connected to the amplifier output terminals 7, 8.

A fraction $\beta E_2$ of the voltage $E_2$ is obtained by means of a tap on resistor 16, and this voltage $\beta E_2$ is connected in series opposition with a biasing battery 19 to provide a feedback voltage $E_{fb}$. This feedback voltage $E_{fb}$ is applied between amplifier input terminal 2 and one of the input terminals of the first amplifying stage 4. The remaining input terminal of stage 4 is directly connected to terminal 3. The output of stage 4 is directly connected to the lamp 11.

The biasing batteries 18, 19 are included in order to permit the amplifier to accept alternating-current as well as direct-current signals. It will be observed that when the voltage $E_s$ applied to the input terminals 2, 3 is zero, the voltage of biasing battery 19 tends to be impressed upon the input of stage 4, causing lamp 11 to tend to light. As lamp 11 tends to light, however, the voltage $\beta E_2$ is developed. This voltage $\beta E_2$ opposes the voltage of bias battery 19, and therefore tends to extinguish lamp 11. These opposing voltages tend to come to an equilibrium point where the lamp 11 is partially lit. The biasing battery 19 is selected so that the partially-lit point is approximately one-half of the rated maximum illumination value of lamp 11.

When the input voltage $E_s$ is zero and lamp 11 is at its mid-brightness value by virtue of biasing battery 19, the voltage $E_1$ is finite (not zero), and tends to cause a finite voltage $E_0$ at the output terminals 7, 8. Since it generally is desirable to have $E_o$ equal zero when the input voltage $E_s$ is zero, the biasing battery 18 is provided to cancel the finite voltage $E_1$ associated with zero input voltage $E_s$.

From the foregoing, it is evident that the input voltage $E_s$ may alternate about zero voltage; that is, the amplifier circuit can respond to alternating-current voltages $E_s$. When terminal 2 goes positive with respect to terminal 3, the lamp 11 becomes brighter than the mid-brightness value; when terminal 2 goes negative with respect to terminal 3, lamp 11 dims from the mid-brightness value. As will readily be appreciated, the maximum frequency alternating-current signal to which the amplifier 1 will respond is the maximum frequency to which lamp 11 will respond, or the maximum frequency to which the photoconductive cells 12, 13 will respond, whichever is lower.

The operation of the amplifier circuit 1 will be apparent from the foregoing. A varying voltage $E_s$ applied to terminals 2, 3 tends to be amplified by stage 4 and cause lamp 11 to vary in brightness with respect to the mid-brightness value, which in turn causes voltages $E_1$ and $E_2$ to vary with respect to their finite values associated with zero input voltage. The variations in voltages $E_1$, $E_2$ tend to be nonproportional with respect to the variations of the varying voltage $E_s$, because of the nonlinear transfer characteristic of the lamp 11 and photoconductive cells 12, 13. However, since the fractional voltage $\beta E_2$ is applied in negative feedback fashion to the voltage $E_s$ at terminals 2, 3, the voltages $E_1$, $E_2$ are constrained to vary very nearly in accordance with the voltage $E_s$. If desired, a rigorous analysis of the linearizing effect of the feedback voltage $\beta E_2$ may be obtained from a textbook on feedback amplifiers. The voltage $E_1$ is amplified by the stage 6, which can be of a conventional highly-linear design, and is fed to the load device (not shown) connected to the output terminals 7, 8.

Thus, the amplifier circuit 1 provides highly linear amplification of direct current and low frequency alternating-current signals. The output terminals 7, 8 are isolated from the input terminals by virtue of the unilateral nature of the lamp 11 and photo-conductive cell 12 coupling unit. In addition, the amplifier, because of the negative feedback around stage 4 and coupling unit 5, tends to be highly stable with respect to changes in the parameters of these units 4, 5. Further, the amplifier utilizes a minimum number of inexpensive components, and is lightweight, rugged, and compact, especially if the stages 4, 6 are transistorized.

The invention has been described by way of a specific illustrative circuit, many variations and modifications of which will be obvious to those skilled in the art. Accordingly, it is intended that the invention be limited only as set forth in the appended claims.

What is claimed is:

1. A four-terminal direct-current amplifier comprising, a pair of input terminals, a pair of output terminals, first and second direct-current amplifying stages, a lamp connected to the output of said first direct-current amplifying stage. first and second substantially identical photosensitive cells disposed to receive substantially identical amounts of illumination from said lamp, means for deriving a first direct-current signal from said first photosensitive cell, means for feeding said first direct-current signal to the input of said second direct-current amplifying stage, the output of said second direct-current amplifying stage being connected to said pair of output terminals, means for deriving a second direct-current signal from said second photosensitive cell, and means for connecting a portion of said second direct-current signal in series with said pair of input terminals and the input of said first direct-current amplifying stage.

2. An amplifier as set forth in claim 1, wherein said means for feeding said first direct-current signal to the input of said second direct-current amplifying stage includes a first biasing battery connected in series opposition with said first direct-current signal, said means for connecting a portion of said second direct-current signal in series with said pair of input terminals and the input of said first direct-current amplifying stage including a second biasing battery connected in series opposition with said second direct-current signal.

3. An amplifier as set forth in claim 2, wherein said second biasing battery is of such value as to cause said lamp to burn at approximately one-half of the rated maximum illumination value when the voltage across said pair of input terminals is zero, said first biasing battery being of such value as to cancel said first direct-current signal when the voltage across said pair of input terminals is zero.

References Cited

UNITED STATES PATENTS

| | | | |
|---|---|---|---|
| 1,631,213 | 6/1927 | Latour | 330—59 |
| 3,163,763 | 12/1964 | Bray et al. | 250—206 |
| 3,213,391 | 10/1965 | Kovalevski et al. | |

ROY LAKE, *Primary Examiner.*

NATHAN KAUFMAN, *Examiner.*